US012805367B2

(12) United States Patent
Meissl et al.

(10) Patent No.: US 12,805,367 B2
(45) Date of Patent: Nov. 17, 2026

(54) METHOD AND APPARATUS FOR BONDING WITH CURVED BONDING HEADS

(71) Applicant: CANON KABUSHIKI KAISHA, Tokyo (JP)

(72) Inventors: Mario Johannes Meissl, Austin, TX (US); Anshuman Cherala, Austin, TX (US)

(73) Assignee: CANON KABUSHIKI KAISHA, Tokyo (JP)

( * ) Notice: Subject to any disclaimer, the term of this patent is extended or adjusted under 35 U.S.C. 154(b) by 336 days.

(21) Appl. No.: 18/756,530

(22) Filed: Jun. 27, 2024

(65) Prior Publication Data

US 2026/0005185 A1 Jan. 1, 2026

(51) Int. Cl.

| | |
|---|---|
| ***H01L 23/00*** | (2006.01) |
| ***H10W 72/00*** | (2026.01) |
| ***H10W 99/00*** | (2026.01) |
| *H10W 80/00* | (2026.01) |

(52) U.S. Cl.

CPC .......... *H10W 72/011* (2026.01); *H10W 99/00* (2026.01); *H10W 72/071* (2026.01); *H10W 80/312* (2026.01); *H10W 80/327* (2026.01)

(58) Field of Classification Search

CPC . H10W 72/011; H10W 72/00; H10W 72/071; H10W 80/312; H10W 80/00; H10W 80/327; H10W 99/00

See application file for complete search history.

(56) References Cited

U.S. PATENT DOCUMENTS

| | | |
|---|---|---|
| 10,249,520 B2 | 4/2019 | Kobrin |
| 2017/0053823 A1 | 2/2017 | Huang |
| 2020/0105548 A1 | 4/2020 | Huang |
| 2021/0291504 A1 | 9/2021 | Wagenleitner |
| 2023/0116581 A1 | 4/2023 | Sreenivasan |
| 2023/0207514 A1 | 6/2023 | Gao |
| 2023/0260954 A1 | 8/2023 | Stokkermans |
| 2024/0038598 A1 | 2/2024 | Funayoshi |
| 2024/0047416 A1 | 2/2024 | Chen |

FOREIGN PATENT DOCUMENTS

| | | |
|---|---|---|
| WO | 2023056068 A1 | 4/2023 |
| WO | 2023056072 A1 | 4/2023 |

*Primary Examiner* — Nikolay K Yushin

(74) *Attorney, Agent, or Firm* — Canon U.S.A., Inc. IP Division

(57) ABSTRACT

An apparatus for bonding multiple pluralities of chiplets to a destination substrate includes one or more bonding heads, each bonding head of the one or more bonding heads having a curved surface configured to hold a plurality of chiplets, a destination stage configured to hold the destination substrate, and a controller configured to operate the movement of the one or more bonding heads and the destination stage. The controller includes a plurality of motors configured to drive each bonding head of the one or more bonding heads in at least the θX, θY, and Z, directions. The curved surface is a convex surface having a curvature bulging towards the destination stage.

24 Claims, 7 Drawing Sheets

METHOD AND APPARATUS FOR BONDING WITH CURVED BONDING HEADS

BACKGROUND

Field

The present disclosure relates to an apparatus for bonding chiplets to a substrate.

Description of the Related Art

In advanced semiconductor packaging technologies, there is a continuous demand to increase throughput in bonding a large number of chiplets onto a destination substrate such as a wafer with high precision and density. An advantage of chiplet-to-wafer direct bonding is to shrink interconnect pitch and drive tighter placement accuracies. Thus, it provides better precision and cleanliness in the semiconductor manufacturing process. Efforts have been made to improve over wafer-to-wafer and chip-to-wafer bonding technologies. One type of such technologies is hybrid bonding.

Hybrid bonding technology allows two separate chiplets to bond together with high precision and density without using micro-bumps. The hybrid bonding technique enables integration of different technologies or materials onto a single chip. To increase efficiency, it is desirable to simultaneously bond multiple chiplets on a wafer.

SUMMARY

According to an aspect of the present disclosure, an apparatus for bonding multiple pluralities of chiplets to a destination substrate includes one or more bonding heads, each of the one or more bonding heads may have a curved surface configured to hold the plurality of chiplets, a destination stage configured to hold the destination substrate, and a controller configured to operate the movement of the one or more bonding heads and the destination stage. The controller includes a plurality of motors configured to drive each bonding head of the one or more bonding heads in at least in the θX, θY, and Z, directions. The curved surface is a convex surface having a curvature bulging towards the destination stage.

Further features of the present disclosure will become apparent from the following description of exemplary embodiments with reference to the attached drawings.

DESCRIPTION OF THE EMBODIMENTS

Figure 1:
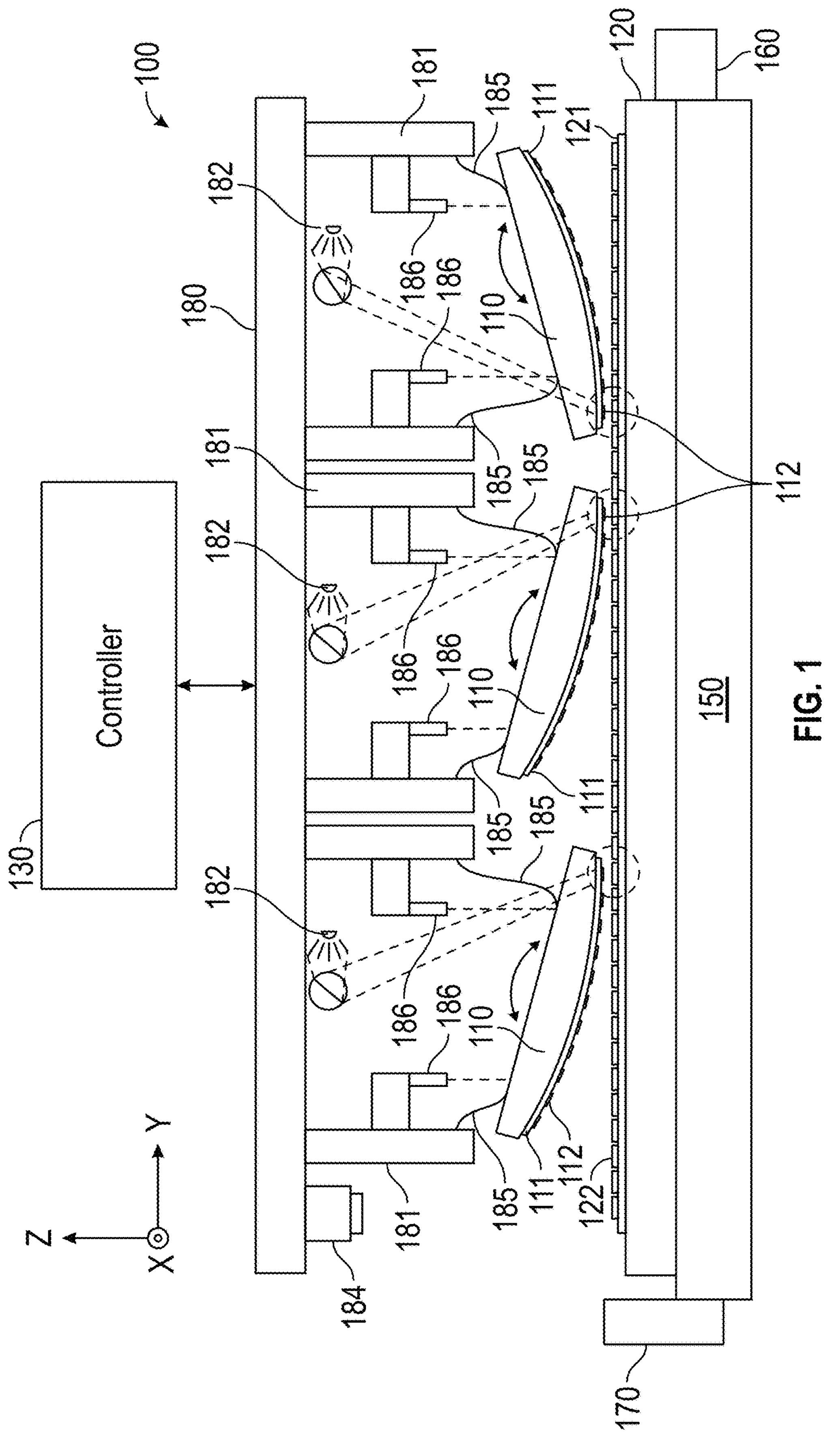
FIG. 1 is a schematic view showing a bonding apparatus.

Exemplary embodiments of the present disclosure will be described in detail below with reference to the attached drawings. The following exemplary embodiments are not intended to limit the claimed disclosure, and not all combinations of features described in the exemplary embodiments are necessarily deemed to be essential. The same components are denoted by the same reference numerals, and descriptions thereof are omitted.

In the specification and the accompanying drawings, directions will be typically indicated on an XYZ coordinate system in which a surface parallel to a horizontal surface is defined as the X-Y plane. Directions parallel to the X-axis, the Y-axis, and the Z-axis of the XYZ coordinate system are defined as the X direction, the Y direction, and the Z direction, respectively. A rotation about the X-axis, a rotation about the Y-axis, and a rotation about the Z-axis are defined as θX, θY, and θZ, respectively. Control and driving (movement) concerning the X-axis, the Y-axis, and the Z-axis mean control or driving (movement) concerning a direction parallel to the X-axis, a direction parallel to the Y-axis, and a direction parallel to the Z-axis, respectively. In addition, control or driving concerning the θX-axis, the θY-axis, and the θZ-axis means control or driving concerning a rotation about an axis parallel to the X-axis, a rotation about an axis parallel to the Y-axis, and a rotation about an axis parallel to the Z-axis, respectively.

In embodiments to be described later, an example in which a substrate (for example a wafer, an interposer, a product board, or other substrate that interconnections that are to be bonded interconnections on the chiplets, etc.) on which semiconductor devices are formed or mounted and a chiplet (or a device having a plurality of interconnections) obtained by dividing into pieces a substrate on which semiconductor devices are formed will be explained. However, various changes and modifications can be made within the scope of the present disclosure. In the embodiments to be described later, various temporary or permanent bonding methods can be applied as a bonding method to bond the chiplets on the curved bonding heads to the destination substrate mounted on the destination chuck. Examples of the bonding method are bonding using an adhesive, temporary bonding using a temporal adhesive, bonding by hybrid bonding (also known as metal-metal bonding, dielectric-dielectric bonding, or direct bonding), atomic diffusion bonding (also known as thermal compression bonding), vacuum bonding, and bump bonding.

Examples of the chiplet to be bonded at a destination site are a stack of chiplets, an optical element, a MEMS, and a structure, in addition to a chiplet obtained by dividing into pieces a wafer on which semiconductor devices are formed. As used herein, a chiplet is an integrated circuit, also referred to as a microchip, a computer chip, etc. Also, a chiplet may be a component that includes a chiplet having a set of interconnect contacts. A chiplet may be defined as a small block of semiconducting material on which a given functional circuit is fabricated. In the context of a substrate (e.g., wafer) that has been divided into individual chiplets. A chiplet will typically carry a set of integrated electronic components and circuits formed on it by patterning, coating, etching, doping, plating, singulating, etc. A chiplet may have electrical functions, such as memory, logic, field-programmable gate arrays (FPGA), accelerator circuits, application-specific integrated circuits (ASICs), security co-processors, graphics-processing units (GPUs), machine-learning circuits, specialized processors, controllers, devices, electrical circuits, and/or arrays of passive components, etc. A chiplet may also be or include a micro-electromechanical systems (MEMS) device, an optical device; an electrical-optical device, a microfluidic device, a piezoelectric device, a thermoelectric device, a spintronic device, and/or a superconducting device, etc.

First Embodiment

FIG. 1 is a schematic view showing the overall configuration of a bonding apparatus 100 according to the first embodiment. The bonding apparatus 100 includes a controller 130, a bridge 180, a plurality of curved bonding heads 110 supporting carrier substrates 111 (also referred to as an intermediate substrate), bonding head driving mechanisms 181, a light source 182, a substrate observation camera 184, a base stage 150, a destination chuck 120, a destination substrate 121, and a chiplet observation camera 170. In an alternative embodiment, the bonding apparatus includes only one curved bonding head 110.

The destination chuck 120 and the chiplet observation camera 170 are mounted on the base stage 150. The curved bonding heads 110, the light source 182, and the bonding head driving mechanism 181 are mounted on a bridge 180. Each of these elements will be discussed in further details below.

In FIG. 1, a direction perpendicular to the holding surface of a destination substrate chuck 120 that holds a destination substrate 121 is defined as the Z direction, and directions orthogonal to each other on a plane parallel to the holding surface of a destination chuck 120 are defined as the X and Y directions. The bonding apparatus 100 is configured to sequentially bond a plurality of chiplets 112 to predetermined placement positions 122 at the destination substrate 121.

The plurality of chiplets 112 are arranged on the carrier substrate 111 which can be, for example, a transfer wafer, a semirigid transparent substrate coated with a cleanroom quality de-bondable adhesive, a dicing tape, or a dicing frame. Examples of a semirigid transparent substrate includes silicon, plastic, and glass substrates that have a sub-mm thickness. The plurality of chiplets 112 are arranged on the carrier substrate 111 and may be arranged in a matrix of rows and columns, where the rows extend at least substantially in parallel to a first rotational axis (Y Axis) and columns extend at least substantially in parallel to a second rotational axis (X Axis).

Figure 2A:
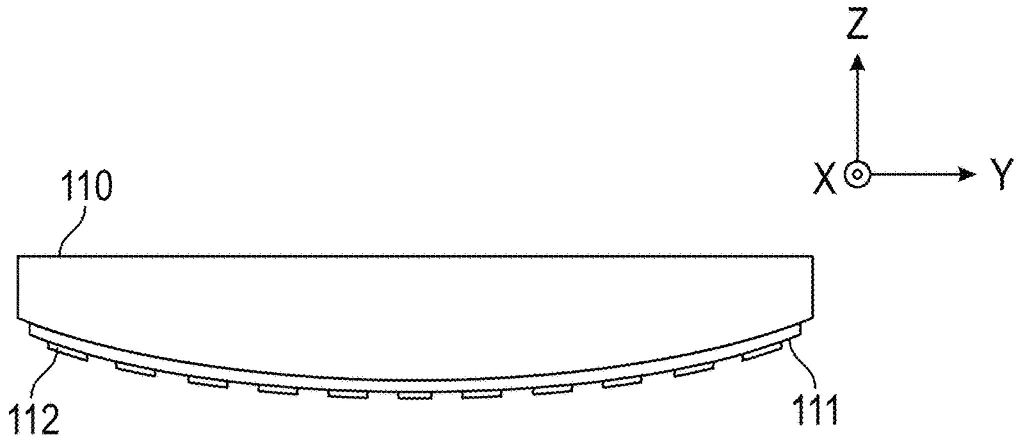
FIGS. 2A and 2B illustrate the side view and top view of a curved bonding head, respectively.
Figure 2B:
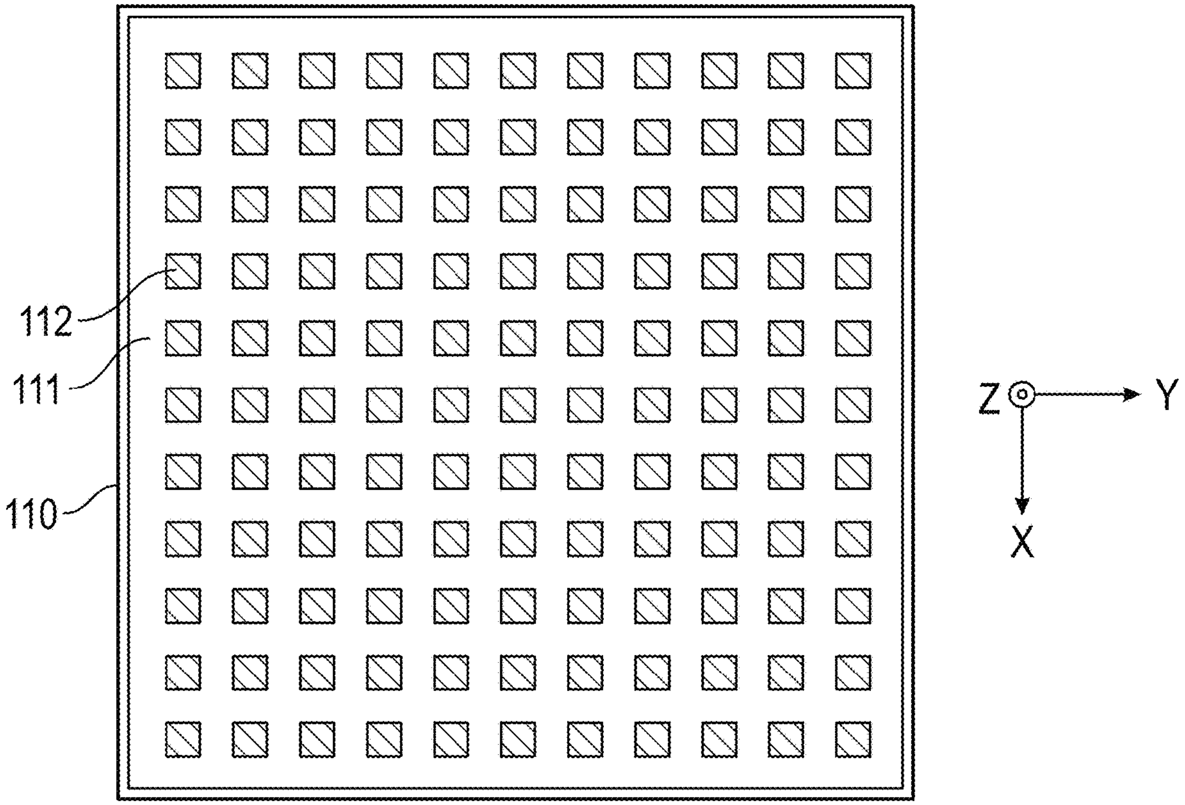

Each of the plurality of curved bonding heads 110 has a convex bonding surface having a curvature bulging towards the destination stage which may be a spherical or elliptical bonding surface. FIG. 2A illustrates a side view of one of the plurality of curved bonding heads 110 when viewed from the side (X-direction). The curved bonding head includes a carrier substrate 111 with a plurality of chiplets 112 attached thereon. FIG. 2B illustrates a top view of a curved bonding heads 110 when viewed from the Z-direction. The curved bonding head 110 having a square shape with chiplets 112 arranged in an array structure. While a square shaped chiplet is illustrated in this example, the curved bonding head 110 may be a polygon shape including but not limited to a rectangle, square, hexagon, triangle or may have a curved shape such as an ellipse or circle. Hereinafter, each of the curved bonding heads 110 will be described as a bonding head having a spherical-cap structure. However, it shall be understood that other three-dimensional curved structures such as an elliptical structure may also be applicable. The bonding can have a convex surface having a curvature bulging towards the destination stage.

Returning to FIG. 1, FIG. 1 illustrates an example of a bonding apparatus 100 with three curved bonding heads, the number of curved bonding heads 110 is not limited to three. The bonding apparatus 100 may include two or more curved bonding heads which may be arranged linearly, in array, or non-linearly, depending on various applications and technical requirements. Each of the curved bonding heads 110 is configured to hold a carrier substrate 111 through vacuum, adhesive or the like on its curved surface. The bridge 180 includes driving mechanisms 181 that drive the plurality of curved bonding heads 110. The bonding head driving mechanism 181 can include a combination of actuators and motors such as linear motors, voice-coil motors, piezoelectric motors, nut-and-screw motors, piezo-actuated stages, brushless DC motor stages, and DC stepper motors and is configured to drive the curved bonding heads 110 at least in the θX, θY, and Z directions. The bonding head driving mechanisms 181 may also be configured to drive the curved bonding heads in the θZ, and X and Y directions. When the bonding apparatus 100 includes only one curved bonding head 110 then the relative motion control in six different directions (X, Y, Z, θX, θY, and θZ) may be split between the bonding head driving mechanism 181 and the base stage 150. When the bonding apparatus 100 includes only more than one curved bonding head 110 then each of the bonding head driving mechanism 181 should have motion control in at least two different directions (θX and θY) and possibly six different directions (X, Y, Z, θX, θY, and θZ). The bridge 180 also includes a light source 182 which is configured to cause the chiplets 112 to release from the carrier substrate 111. The light source 182 may include a source of light and a light modulation unit. The light modulation unit may include one or more of a scanning mirror(s), spatial light modulator, lenses, prisms, polarizers, sensors, etc. The light modulation unit is configured to guide light from the source of light to the back of the chiplet. The chiplet releasing mechanism will be described in more details later.

The destination chuck 120 is configured to hold the destination substrate 121 through vacuum forces of a vacuum chuck; through electrostatic forces of a electrostatic chuck; through electromagnetic forces of an electromagnetic chuck; through mechanical forces of a latch-type chuck, an edge-gripping chuck, a pin-type chuck, or a groove-type chuck; or the like on a surface parallel to the X and Y directions. The destination chuck 120 or the base stage 150 can include a base stage driving mechanism 160 that drives the destination chuck 120 in the X, Y and Z, and θZ directions. The base stage driving mechanism 160 can include actuators and motors such as linear motors, voice-coil motors, piezoelectric motors, nut-and-screw motors, piezo-actuated stages, brushless DC motor stages, and DC stepper motors, and is configured to drive the destination substrate 121 in the X and Y directions as well as the θZ directions. A relative rotational operation of the destination substrate 121 and the chiplet 112 in the θZ direction may be performed by rotating the destination substrate 121 by the base stage 150. The destination substrate 121 includes a plurality of predetermined placement positions 122 which may be a physical indicator, a marking, or a semiconductor device, etc. The predetermine placement positions 122 are configured to indicate the proper positions for the chiplets 112 to be bonded on the destination substrate 121. The predetermined placement positions 122 may include a plurality of destination interconnect pads (not shown) that are to be aligned with chiplet interconnect pads on each chiplet using the bonding head driving mechanisms 181.

The controller 130 is formed from, for example, an information processing apparatus including one or more processors such as Central Processing Units (CPU) and one or more computer-readable memories. The controller 130 may include one or more of: a processor; a plurality of processors that communicate over a bus; a plurality of processors that communicate over a local intranet; a plurality of processors that communicate over a wide area internet. The processor may include one or more of a processor, CPU, GPU, ASIC, FPGA, or one or more integrated circuits configured to send and receive instructions and perform operations on information stored in computer readable memory. The controller 130 controls the bonding process by controlling each component of the bonding apparatus 100. Each of the curved bonding heads 110 includes a bonding head driving mechanism 181 which may comprise a 3-axis motor capable of driving the curved bonding heads 110 in the X, Y, and Z direction, or a 6-axis motor having six degrees of freedom capable of driving the curved bonding heads 110 in a X, Y, Z, θX-axis, the θY-axis, and the θZ-axis directions. Accordingly, the controller 130 controls the bonding head driving mechanism 181 for the curved bonding heads to move in the various directions in the bonding process. Each of the curved bonding heads having its own bonding head driving mechanism 181 such that each curved bonding heads can operate independently, and thus, is able to perform chiplet bonding in parallel to improve throughput. In an alternative embodiment, the bonding heads may be loaded with chiplets having different properties such as size and thickness.

The bonding head driving mechanism 181 may include one or more actuators, one or more flexures 185, and one or more bonding head position sensors 186. The bonding head driving mechanism 181 may have positioning accuracy in the x and y directions (for example 1 μm, 0.1 μm, 0.01 μm, or 0.001 μm positioning accuracy) over a positioning range (for example 10 mm, 1 mm, 100 μm, 10 μm positioning range). The bonding head driving mechanism 181 may have rotation accuracy in the θX-axis and/or the θY-axis (for example 1 urad, 0.1 urad, or 0.01 urad rotation accuracy) over a sub-radian rotation range (for example 1 urad, 10 urad, 100 urad, 1 mrad, 150 mrad, 300 mrad, or 500 mrad rotation range). The bonding head driving mechanism 181 may have rotation accuracy in the θZ-axis (for example 1 milliradians, 10 milliradians, 0.1 milliradians, 0.05 milliradians, or 0.01 milliradians rotation accuracy) over a sub-milliradian rotation range (for example 0.1 milliradians, 0.05 milliradians, or 0.01 milliradians rotation range). The bonding head driving mechanism 181 may have positioning accuracy in the Z direction greater than in the x and y directions (for example 2 mm, 1 mm, 0.1 mm, or 0.05 mm, or 0.02 mm positioning accuracy) over a sub-mm positioning range (for example 4 mm, 2 mm, 0.1 mm, 0.05 mm, or 0.02 mm positioning range). The base stage 150 may have a positioning accuracy that is less than the positioning accuracy of the bonding head driving mechanism 181 over a large positioning range (for example 1 mm, 10*s* mm, or 100*s* mm of positioning range).

The controller 130 obtains the predetermined placement positions 122 provided on the bonding surface of the destination substrate 121 based on an image of the bonding surface of the destination substrate 121 that is captured by the substrate observation camera 184 or based on arrangement information received from memory. Also, the controller 130 obtains the position of the predetermined pattern provided on the bonding surface of the chiplet 112 based on an image of the bonding surface of the chiplets 112 that is captured by the chiplet observation camera 170 or based on arrangement information received from the memory. The controller 130 can control the bonding process based on the position of the pattern of interconnect connections of the destination substrate 121 and that of the pattern of interconnect connections of the chiplets 112.

The chiplet observation camera 170 is a camera for observing the bonding surface of the chiplets 112. The chiplet observation camera 170 can be arranged so that it can capture an image of the bonding surface of the chiplet 112 in a state in which the chiplet 112 is held by the curved bonding heads 110. In this embodiment, the chiplet observation camera 170 is mounted on the base stage 150 and can move in the X and Y directions along with movement of the base stage 150. The chiplet observation camera 170 is used to obtain information representing the position of a pattern provided on the bonding surface of the chiplet 112, and information representing the positional relationship between the feature portion of the chiplet 112 and the pattern provided on the bonding surface of the chiplet 112.

The chiplet observation camera 170 is an image capture device that can also be used to measure the distances of a plurality of points in the direction of height in the Z direction on the bonding surface of the chiplet 112. That is, the chiplet observation camera 170 can be used to measure the position of the chiplet 112 held by the curved bonding head 110 in the direction of height, the tilt of the chiplet 112, and/or the flatness of the bonding surface.

In the bonding apparatus 100 according to this embodiment, the controller 130 controls the substrate observation camera 184 to capture an image of the chiplet 112 bonded to the destination substrate 121 after the bonding process of the destination substrate 121 and the chiplets 112. Based on the image obtained by the substrate observation camera 184, the controller 130 obtains feature position information representing the position of the chiplets 112 with respect to the destination substrate 121. Then, the controller 130 estimates the relative position between the pattern of the destination substrate 121 and that of the chiplets 112 after the bonding process based on the feature position information and positional relationship information representing the positional relationship between the pre-obtained image of the chiplets 112 and the pattern of the chiplets 112. Accordingly, the pattern of the destination substrate 121 and that of the chiplets 112 after the bonding process can be easily and accurately obtained.

The present bonding apparatus 100 may employ different chiplet releasing mechanism. For example, if the chiplet releasing mechanism is an ultraviolet (UV) releasing mechanism, the curved bonding heads 110 should at least be partially translucent for light having a specific wavelength such as UV light or IR light. As illustrated in FIG. 1, each of the curved bonding heads 110 includes a dedicated light source 182. However, the bonding apparatus 100 may include any number of light sources as necessary for the purpose of releasing chiplets to the destination substrate in a bonding process. For example, the light source may include a beam splitter for splitting the received beam into a plurality of further beams for chiplet releasing purposes. The light source 182 may include a source of light, and a mechanism for steering the light towards the chiplet to be illuminated. The mechanism for steering may include one or more of lenses, mirrors, scanning system, galvanometer scanner, a steering mirror, digital micromirror device, deformable mirror, or other systems for guiding light towards a specific programmable location on the carrier substrate 111 held by the curved bonding head 110.

In one embodiment, the releasing unit includes at least one light source 182, for illuminating at the specific wavelength. The chiplets 112 can be attached to a carrier substrate 111 that is or includes a UV tape or UV film using a light-absorbing agent that is configured to release the chiplets when illuminated with the light with the specific wavelength. In an alternative, embodiment, the curved bonding heads 110 may include a mechanical mechanism for initiating release of the chiplets 112 from the carrier substrate 111. For example, a bonding pin (not shown) can be embedded in each of the bonding heads 110 in a retracted position behind the chiplet 112. When it is time to release the chiplet 112, the bonding pin extends toward the chiplet 112 and pushes the chiplet 112 to the predetermined placement positions 122 of destination substrate 121.

Each of the curved bonding heads 110 may include a source chuck surface for holding a carrier substrate 111. The source chuck may be a vacuum chuck; an electrostatic chuck; an electromagnetic chuck; a latch-type chuck, an edge-gripping chuck, a pin-type chuck, a groove-type chuck, or a chucking surface that has a temporary adhesive. In an alternative embodiment, the carrier substrate 111 may be adhered to the curved bonding head 110 with a temporary adhesive or held with vacuum pressure. Prior to loading a carrier substrate 111 onto the bonding apparatus 100, chiplets 112 are temporarily adhered to the carrier substrate 111. The carrier substrate 111 may be an adhesive film (for example a UV or IR tape), or may be a plate on which an adhesive film is formed or applied. Two or more (for example 10s, 100s or 1000s) chiplets 112 may be temporarily adhered to the carrier substrate 111 with their bonding surfaces that include the chiplet interconnect facing away from the carrier substrate 111.

An activation process may be performed on the bonding surfaces of the chiplets in an activation module prior to the carrier substrates 111 being loaded into the bonding apparatus 100. In an alternative embodiment, the bonding apparatus includes an activation module that performs an activation process. The activation process may include exposing the bonding surfaces to a plasma. The activation process may include rinsing the bonding surfaces with a fluid such as deionized water. The carrier substrate 111 with chiplets 112 that have an activated bonding surface is loaded onto the curved bonding heads 110 without touching the activated bonding surfaces. In an embodiment, a back surface of the carrier substrate 111 is not curved when the chiplets 112 are adhered to the front surface of the carrier substrate 111 and when the bonding surfaces are activated. When it is time for an individual chiplet 112 to be released from the carrier substrate 111, that is, when a an individual chiplet 112 is in contact with a predetermined placement position 122 on the destination substrate 121, a light source with the specific wavelength (for example UV or IR) is illuminated on the adhesion layer of the carrier substrate 111 of the target chiplet to allow the target chiplet to be released from the carrier substrate 111.

In this embodiment, the bonding of the chiplet 112 to the destination substrate 121 is performed by driving the curved bonding heads 110 in the −Z direction in combination with rotational movements such as θX, θY, and θZ by the bonding head driving mechanisms 181. In addition, the base stage 150, can move in the X, Y and Z direction to assist with the bonding process. For instance, the base stage 150 is moved such that there is a predetermined placement position 122 under target chiplets 112 of the two or more of the curved bonding heads 110. By moving and rotating the curved bonding heads 110 using bonding head driving mechanism 181, carrier substrate 111 can be positioned relative to a destination substrate 121 on which chiplets 112 are to be placed. The bonding head driving mechanism 181 will rotate each of the bonding heads in the θX and θY directions so that target chiplets 112 that are to be bonded are substantially parallel to the destination substrate 121. In an embodiment, prior to bonding only one chiplet 112 on each curved bonding head is substantially parallel to the destination substrate. In the present context, a chiplet 112 being substantially parallel means that an average plane of the bonding surface of the chiplet is within 0.1-1 µrad depending on the greatest width of the chiplet 112 of an average plane of a bonding surface at the predetermined placement position 122 underneath the chiplet 112 on the destination substrate. The bonding head driving mechanism 181 will also translate each of the bonding heads in the X and Y directions so that target chiplet interconnect contacts target are aligned with destination interconnect contacts at the predetermined placement positions 122. The proper positions for the chiplets 112 to be bonded are depicted in the dotted circles in FIG. 1 where the chiplets 112 are substantially parallel with the desired predetermined placement positions 122 of the destination substrate 121. Once the curved bonding head 110 has been properly rotated and aligned the chiplet 112 with the predetermined placement positions 122 on the destination substrate 121, the chiplet 112 is brought into contact with the predetermined placement position 122 and the light source 182 is employed for releasing a target chiplet 112 from carrier substrate 111 allowing chiplet 112 to stay bonded to the predetermined placement positions 122 on destination substrate 121.

In this embodiment, each of the light sources 182 can be configured to illuminate a single target chiplet among the plurality of chiplets 112 on a carrier substrate 111 at a time and a light source is directly arranged on top of or near each of the curved bonding heads 110. In an alternative embodiment, a single light source 182 is used for all of the curved bonding heads 110 and one or more optical components (not shown) are used to guide light from the light source 182 to individual target chiplets 112 on each of the curved bonding heads 110 that are released individually. For each curved bonding head 110 only one target chiplet 112 is released at a time.

The substrate observation camera 184 is an image capture device configured to observe the bonding surface of the destination substrate 121. The observation camera 184 can be arranged so that it can capture an image of the destination substrate 121 in a state in which the destination substrate 121 is held by the destination chuck 120. The substrate observation camera 184 can be used to obtain information representing the predetermined placement positions 122 provided on the bonding surface of the destination substrate 121, and information representing the position of the chiplets 112 with respect to the destination substrate 121 after bonding the destination substrate 121 and the chiplets 112. The substrate observation camera 184 can also be used to measure the distances of a plurality of points in the direction of height in the Z direction on the bonding surface of the destination substrate 121, that is, the height distribution of the bonding surface of the destination substrate 121. That is, the substrate observation camera 184 can be used to measure the position of the destination substrate 121 held by the destination chuck 120 in the direction of height, the tilt of the destination substrate 121, and/or the flatness of the bonding surface.

Second Embodiment

Figure 3A:
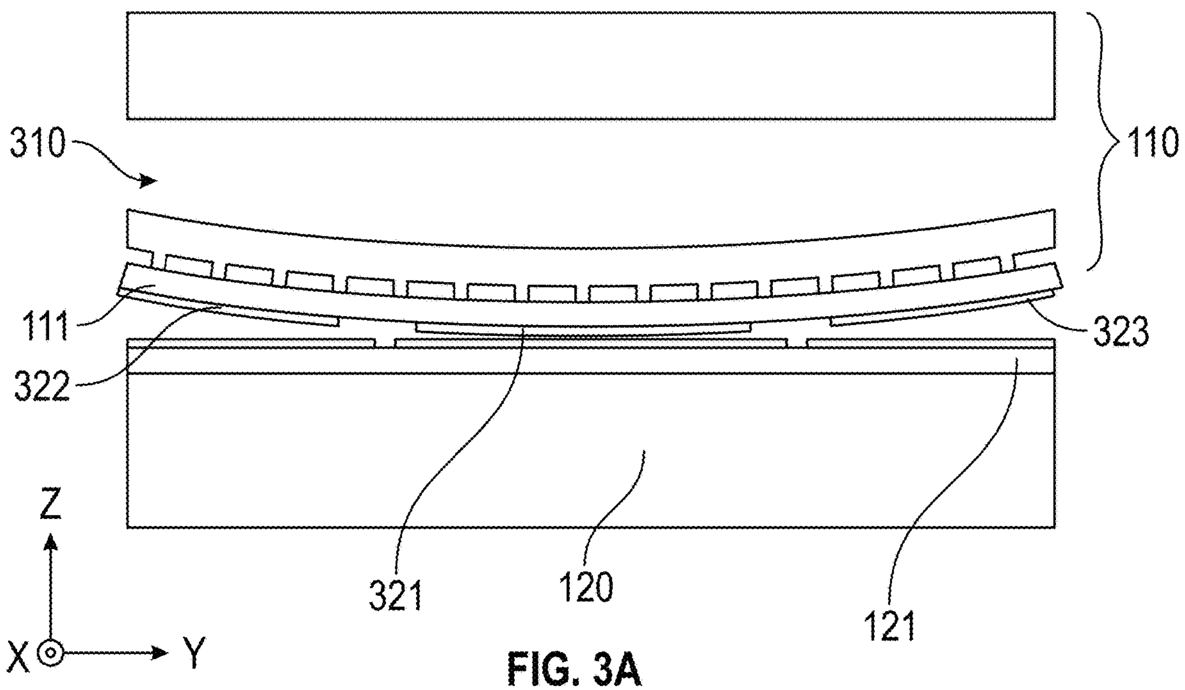
FIG. 3A is a close-up view illustrating a bonding head of the bonding apparatus of FIG. 1 according to a second embodiment.

FIG. 3A is a close-up view of a portion of one of the curved bonding heads 110 of bonding apparatus 100 in accordance with a second embodiment of the present disclosure. Each elements operates the same way as described above in connection with FIG. 1. Thus, the descriptions thereof will be omitted. In the second embodiment, the curved bonding head 110 further includes an air cavity 310 for modulating the curvature of the convex surface of the curved bonding heads 110. Upon loading the respective carrier substrate 111, the air cavity 310 includes an opening which allows air pressure to be modulated by, for example, a pneumatic valve (not shown) that adjusts the pressure inside the air cavity 310 based on instructions from the controller 130. By adjusting the air pressure within the air cavity 310, the spherical curvature of the curved bonding head 110 can be modulated. The curvature of the curved bonding head 110 can be modulated such that the adjacent chiplets on the carrier substrate 111 do not contact the destination substrate 121 during the bonding process. For example, when chiplet 321 is to be released to destination substrate, the adjacent chiplets in the Y direction, for example chiplets 322 and 323, and the adjacent chiplets in the X direction (not shown), will not be in contact with the destination substrate 121. Due to the curvature of the chiplet 321 prior to bonding, the middle section of the chiplet 321 shall come into contact with the destination substrate before the corners of chiplet 321 come into contact with the destination substrate 121. The thickness (0.01-1 mm) of the chiplets and the distance between individual chiplets will determine a lower limit on the curvature of the bonding head. The curvature of the bonding head may be determined based on the properties of chiplets, their distance from each other, the distance between bonding locations, topography of the bonding locations, etc. The curvature is selected to ensure that only one chiplet per bonding head comes into contact with the destination substrate 121 bonding surface at a time. Chiplets 321, 322, and 323 of FIG. 3A may have the same thickness or different thicknesses. In the event that the chiplets have different thicknesses, the motion of the curved bonding head 110 in the Z direction may take these different thicknesses into account during the bonding process. The curvature of the curved bonding head 110 may also be adjusted to take into account the variation in the thickness so as to avoid neighboring chiplets from being contaminated during bonding. The curved bonding head 110 may include chiplets of different types or there may be some natural variation in the thickness of the chiplets.

Third Embodiment

Figure 3B:
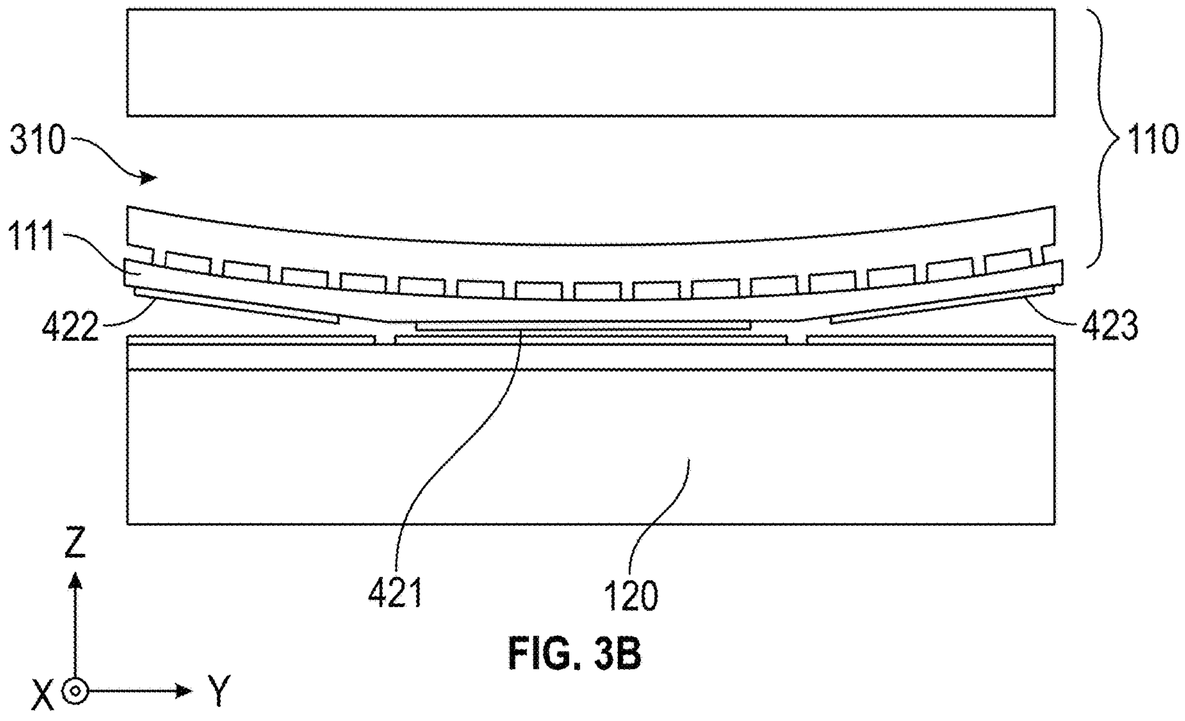
FIG. 3B is a close-up view illustrating a bonding head of the bonding apparatus of FIG. 1 according to a third embodiment.

FIG. 3B is a close-up view of one of the curved bonding heads 110 of bonding apparatus 100 in accordance with a third embodiment of the present disclosure. Each element operates the same way as described above in connection with FIG. 1. Thus, the descriptions thereof will be omitted. Similar to the second embodiment, the curved bonding heads 110 also includes an air cavity 310 configured to modulate the convex surface of the curved bonding head 110. In the third embodiment, the carrier substrate 111, which adheres to the curved bonding heads 110, contains a plurality of polyhedral flat surfaces on the surface on which chiplets are attached. The back side of the carrier substrate 111 may be flat and is conformable, bendable and deformable to follow the shape of the chucking surface of the curved bonding head 110 as illustrated in FIG. 3B. As illustrated in FIG. 3B, each of the chiplets 421, 422, and 423 are adhered to a polyhedral flat surface of the carrier substrate 111. As a result, the chiplets 421, 422, and 423 are flat, corresponding to the flat polyhedral surfaces of the carrier substrate 111, prior to bonding with destination substrate 121. The shape of carrier substrate 111 allows the curved bonding head 110 to apply a bonding force (for example 20 N) to the entire back surface of the chiplet 112 while it is on the carrier substrate 111 to force the chiplet 112 to conform to the shape of the predetermined placement positions 122, while also preventing other chiplets 112 on the carrier substrate 111 from contacting the destination substrate 121. In an embodiment, the air cavity 310 can be used to modulate the polyhedral surfaces into a convex shape so that the middle section of the chiplets comes into initial contact before the corners, subsequently the air cavity 310 can remodulated so that the polyhedral surfaces resume a flat state.

Fourth Embodiment

Figure 3C:
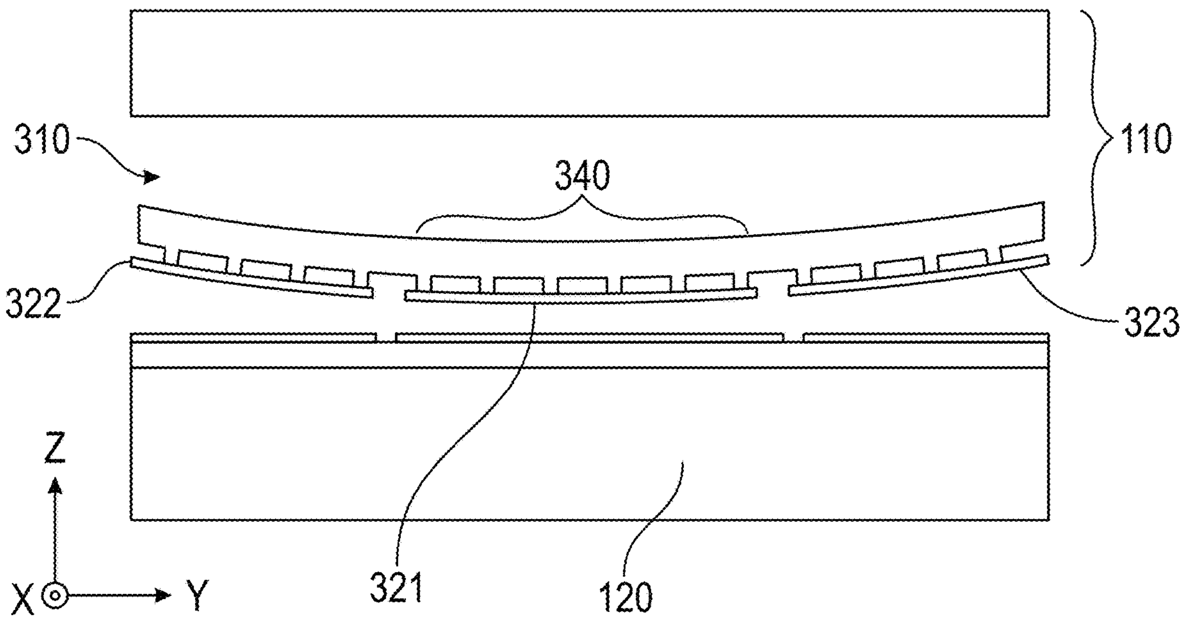
FIG. 3C is a close-up view illustrating a bonding head of the bonding apparatus of FIG. 1 according to a fourth embodiment.

FIG. 3C is a close-up view of one of the curved bonding heads 110 of bonding apparatus 100 in accordance with a fourth embodiment of the present disclosure. Each element operates the same way as described above in connection with FIG. 1. Thus, the descriptions thereof will be omitted. Similar to the second embodiment, the curved bonding head 110 also includes an air cavity 310 configured to modulate the curvature of the convex surface of the curved bonding head 110. In the fourth embodiment, there is no carrier substrate 111, and instead, chiplets 112 are held directly by the curved bonding head 110. Each curved bonding head 110 includes a plurality of holding regions 340 as illustrated in FIG. 3C. Each set of holding region is configured to hold a single chiplet. For example, chiplet 321 is held by the set of holding regions 340. Each of the holding regions may be a vacuum chuck, electrostatic chuck or magnetic chuck that is individually addressable. In this embodiment, the bonding apparatus 100 does not include the light source 182 and the releasing function is performed by the vacuum function of the individual holding regions. In which case the releasing unit includes a pressure mechanism for adjusting the holding pressure on individual chiplets. Each of the holding regions may be defined by one or more lands and may include one or more pins. The curvature of the convex surface of the bonding head is defined by contacting surfaces of the lands and pins on the bonding head.

Fifth Embodiment

Figure 3D:
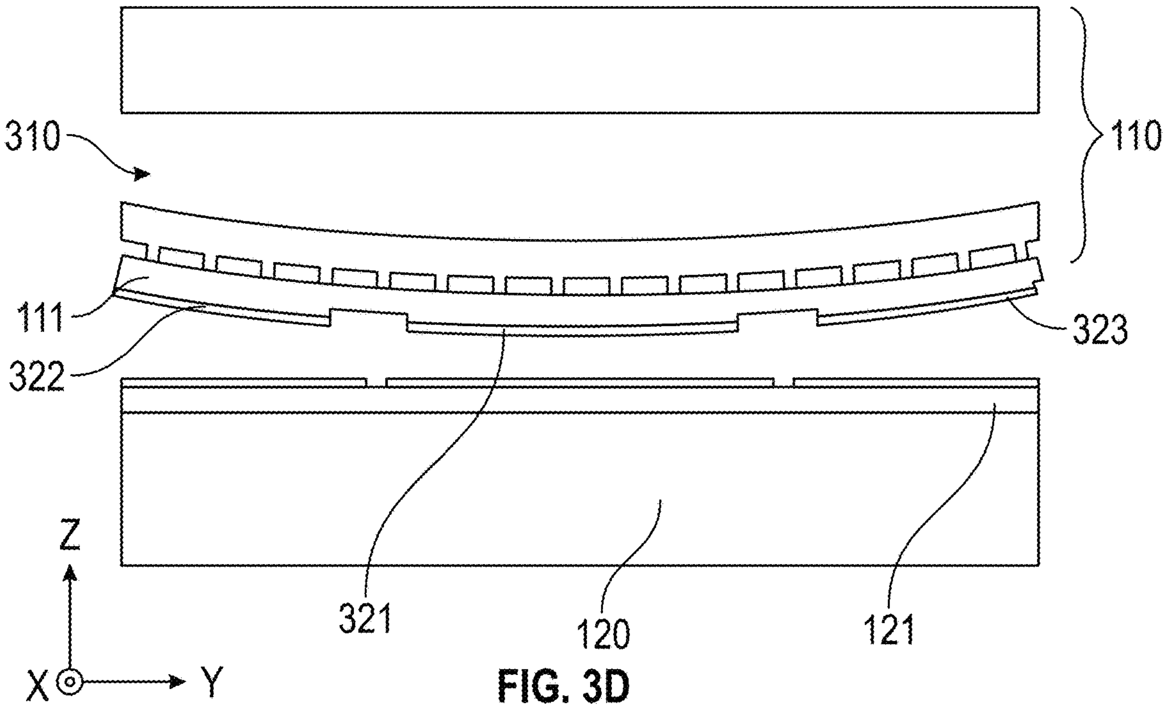
FIG. 3D is a close-up view illustrating a bonding head of the bonding apparatus of FIG. 1 according to a fifth embodiment.

FIG. 3D is a close-up view of one of the curved bonding heads 110 of bonding apparatus 100 in accordance with a fifth embodiment of the present disclosure. Each element operates the same way as described above in connection with FIG. 1. Thus, the descriptions thereof will be omitted. Similar to the second embodiment, the curved bonding head 110 also includes an air cavity 310 configured to modulate the curvature of the convex surface of the curved bonding head 110. In the fifth embodiment, the carrier substrate 111 includes a plurality of mesas. Each mesa may hold a single chiplet, for example, chiplet 321 as illustrated in FIG. 3D. In an alternative embodiment, there is no carrier substrate 111 and the curved bonding head 110 itself has mesas and each mesa has a holding region for holding a chiplet.

<Curvature>

Figure 3E:
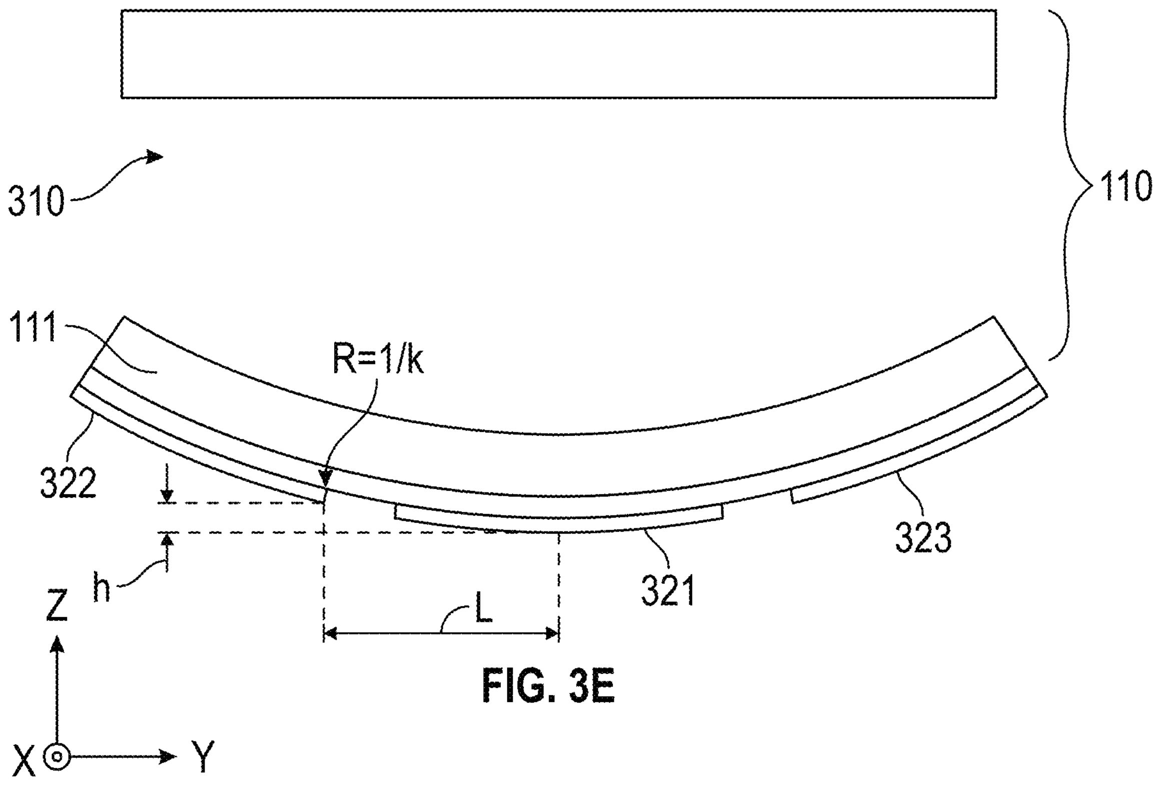
FIG. 3E is a close-up view illustrating an exemplary curvature of a bonding head of the bonding apparatus of FIG. 1.

FIG. 3E is a close-up view of one of the curved bonding heads 110 of bonding apparatus 100 illustrating how the curvature K of the bonding head 110 is determined and influences the behavior of the bonding apparatus. The curvature K of the bonding head 110 allows the bonding head 110 to bond chiplet 321 while preventing neighboring chiplets 322 and 323 from contacting the destination substrate 121. This is accomplished by ensuring that there is a required vertical clearance h including random chiplet thickness deviation of the dies that is uncompensated for by the bonding apparatus 100. The required vertical clearance h may be for example 1-100 μm. The curvature K of the bonding head 110 is also dependent upon an interference distance L between a bottom of the chiplet 321 being bonded and a lowest point of a neighboring chiplet (322 and 323). This interference distance L is related to a width of the chiplets and a mounting pitch of the chiplets the curved bonding head 110. The interference distance L may be for example 1-30 mm. The curvature K of the bonding head 110 is a spatial derivative of a normal vector on the surface of the bonding head 110. The curvature K of the bonding head 110 is also an inverse of a radius of curvature R of a sphere at that contact point. The relationship between a minimum curvature k of the bonding head 110, a maximum radius of curvature, an interference distance L, and a vertical clearance h is described by equation (1) below.

$$\kappa_{min} = \frac{1}{R_{max}} = \frac{2h}{L^2 + h^2} \approx \frac{2h}{L^2} \quad (1)$$

A controller 130 may receive information about the chiplets and determine either by calculation or lookup in a table vertical clearance h and an interference distance L. The controller 130 may then determine target curvatures or a target radius of curvature based on for example equation (1) or a lookup table. The controller 130 will then select an appropriate curved bonding head with a curvature that is close to the target curvature and/or adjust the pressure supplied to air cavity 310. For example, the minimum curvature k of the bonding head 110 may be between 0.004-200 $m^{-1}$ and the maximum radius of curvature R of the bonding head may be between 0.005-225 m. There are also maximum limits on the minimum curvature K of the bonding head 110 and the minimum radius of curvature R based on the elastic limits of the chiplets (bending the chiplets can damage them). The maximum radius of curvature and size of the bonding may also be limited by the angular range of motion of bonding head driving mechanisms 181.

<Method of Bonding with a Bonding Apparatus>

Figure 4:
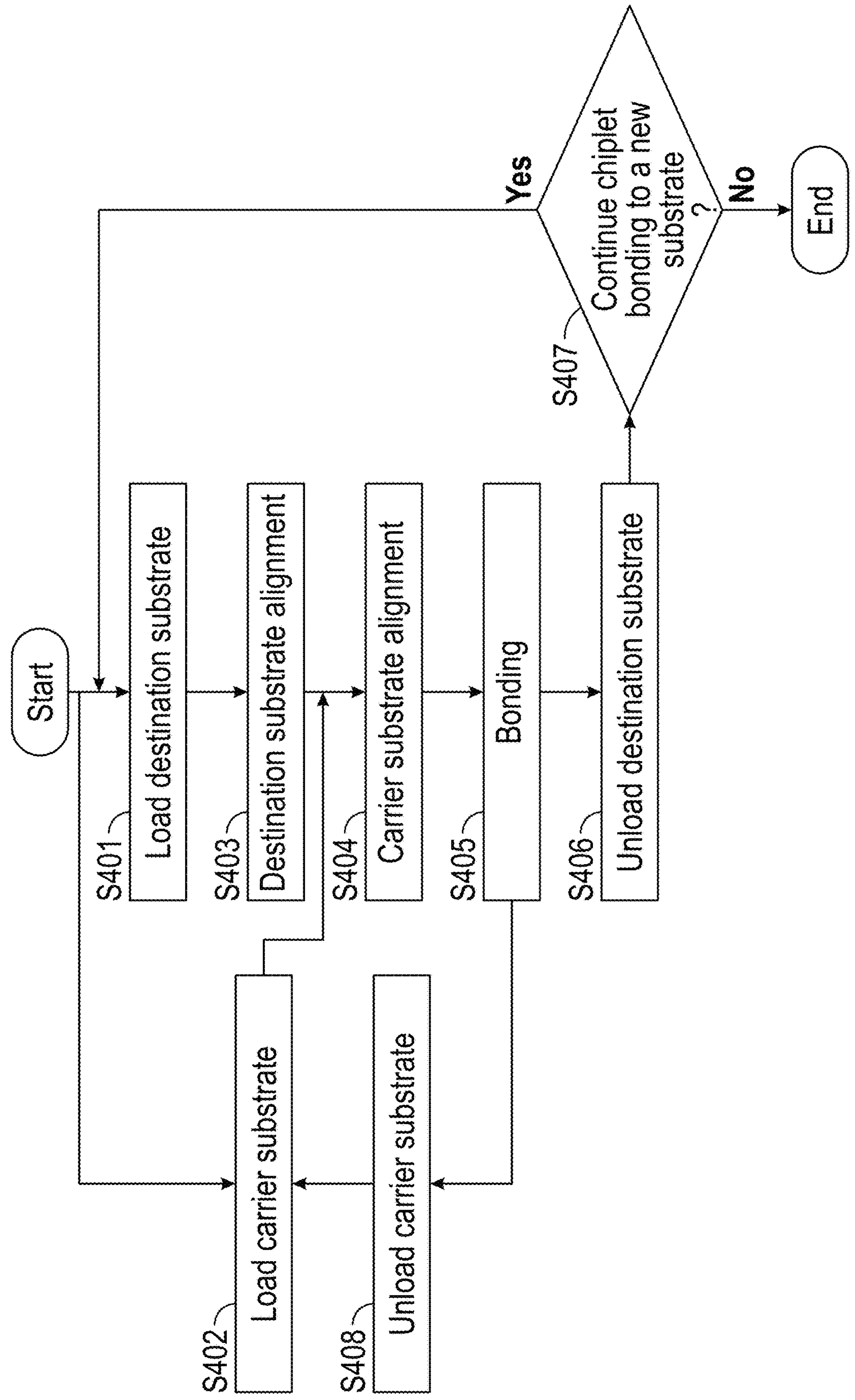
FIG. 4 is a flowchart showing the operation sequence of the bonding apparatus of FIG. 1.

FIG. 4 is a flowchart showing the operation sequence of the bonding apparatus 100 in FIG. 1. A controller 130 can execute processes in the flowchart of FIG. 4.

In this example, the chiplet to be bonded to the destination substrate will be referred to as the "target chiplet" and the predetermined location for the target chiplet will be referred to as the "target predetermined location".

In step S401, the controller 130 loads the destination substrate 121 onto a destination chuck 120 of the bonding apparatus 100 using a conveyance mechanism (not shown). The destination substrate 121 includes a plurality of predetermined placement positions 122 indicating where the chiplets 112 shall be bonded.

To ensure the cleanliness of the destination substrate 121, a washing mechanism (not shown) that washes the destination substrate 121 may be provided in the bonding apparatus 100. A mechanism that performs preprocessing for the bonding process on the destination substrate 121 may also be provided in the bonding apparatus 100. For example, the preprocessing is processing of applying an adhesive to the bonding surface of the destination substrate 121 in bonding using an adhesive, or a preprocessing of activating the bonding surface of the destination substrate 121 when the bonding apparatus 100 is used for hybrid bonding. The activation of the bonding surface of the destination substrate 121 may be performed prior to the destination substrate 121 being loaded onto the destination chuck 120 or while the destination substrate 121 is on the destination chuck 120. The activation of the bonding surface may include a plasma treatment followed by a liquid treatment that creates dangling bonds on the bonding surface.

In step S403, the controller 130 performs destination substrate alignment using a substrate observation camera 184. In the destination substrate alignment process, the substrate observation camera 184 captures an image of the bonding surface of predetermined placement positions on the destination substrate 121 to which the chiplets 112 are to be bonded. Based on the obtained image, the position of a pattern provided on the destination substrate 121 is obtained and relative positions of the predetermined placement positions 122 with respect to the base stage 150 are determined. The substrate observation camera 184 may also use non-imaging-based techniques to determine the position of the predetermined placement positions relative to the base stage 150.

When an alignment mark or fiducial (not shown) is provided on the bonding surface of the destination substrate 121, the position of the pattern of the destination substrate 121 can be obtained using the alignment mark together with the predetermined placement positions 122.

For example, the controller 130 can measure the predetermined placement position 122 on the destination substrate 121 together with measuring the position of an alignment mark provided with respect to the center of the image obtained by the substrate observation camera 184. The bonding apparatus 100 can use this obtained positional information of the destination substrate 121 for alignment in the bonding process.

Steps S401 and S403 described above are processes regarding the destination substrate 121. In parallel to steps S401 and S403, the process for step S402 regarding the chiplet 112 is performed. In step S402, the controller 130 loads each of the one or more curved bonding heads 110 with a carrier substrate 111 having an arrangement of chiplets as described above using a conveyance mechanism (not shown). To ensure the cleanliness of the chiplets 112, a washing mechanism that washes the chiplet 112 can be performed prior to loading to the carrier substrate. In the event that the bonding process of the bonding apparatus 100 is used for hybrid bonding, chiplets may be activated. The activation of the bonding surface of the chiplets 112 may be performed: prior to the chiplets being loaded onto the carrier substrate 111; prior to the carrier substrate 111 being loaded onto the curved bonding head 110; or while the carrier substrate 111 is on the bonding head 110. Then, the process proceeds to step S404.

By the above processes, the destination substrate 121 is held by the base stage 150, and the target chiplets 112 are held by the plurality of the curved bonding heads 110.

Subsequently, in step S404, the controller 130 performs chiplet alignment using the chiplet observation camera 170. In the chiplet alignment, as shown in FIG. 1, the chiplet observation camera 170 is arranged below carrier substrate 111 with the target chiplets 112 held by the curved bonding head 110 by driving the base stage 150 on which the chiplet observation camera 170 is mounted. The chiplet observation camera 170 captures an image of the bonding surfaces of the target chiplets 112, and the position of the pattern provided on the bonding surfaces of the chiplets 112 are obtained based on the captured image.

For example, the controller 130 can measure the position of the pattern of the target chiplet 112 by measuring the image position of the alignment mark of destination substrate 121 with respect to the center of the image obtained by the chiplet observation camera 170. The pattern of the target chiplet 112 may include an arrangement of chiplet interconnect contacts on chiplet bonding surface. Each of the chiplet interconnect contacts may be, for example, an electrical connection such as a pad of conductive material (for example copper) surrounded by a dielectric material. The conductive material may be slightly recessed (by for example 5-10 nm) below the dielectric material. The bonding surface may be made of dielectric material. While the alignment is done using the recessed conductive surfaces. The pad may be in the shape of a circle, a polygon, a polygon with rounded corners, or any other shape that allows information to be passed from the destination substrate 121 and chiplet 112. The measurement of the position of the target chiplet 112 can include measurement of the position of the chiplet such as rotation amount (rotation in the θZ direction) of the target chiplet 112. The rotation amount of the target chiplet 112 can be measured by, for example, obtaining the positions of respective positions on the bonding surface of the target chiplet 112 based on the image obtained by the chiplet observation camera 170. The positions of the respective portions can be obtained based on a plurality of images obtained by individually capturing the specific portions while driving the chiplet observation camera 170 by the base stage 150. In an alternative embodiment, the chiplet observation camera 170 uses non-imaging techniques to determine the position of the interconnect contacts on the chiplet relative to the curved bonding head 110.

During execution of step S404, the surface position of the bonding surface of the target chiplet 112 can be measured using a second height measurement (not shown) that measures the surface position of the bonding surface of the target chiplet 112. Since the thickness of the various target chiplets may vary, the surface position of the target chiplet 112 is important to accurately control the gap between the destination substrate 121 and the target chiplet 112 in the bonding process. Further, the heights of a plurality of positions on the bonding surface of the target chiplet 112 may be measured to adjust the relative postures of the destination substrate 121 and target chiplet 112 based on the measurement result in the bonding process. The controller 130 can adjust the relative postures by driving the bonding head driving mechanism 181.

In step S405, the controller 130 sequentially bonds the target chiplets 112 to the destination substrate 121 by driving the curved bonding head 110 with the bonding head driving mechanism 181 to a position such that the target chiplet 112 is substantially parallel with the predetermined placement position 122 at the destination substrate 121 as depicted by the dotted circles of FIG. 1. In certain embodiments, the controller may drive the base stage 150 via the base stage driving mechanism to assist with the alignment of the chiplet 112 and predetermined placement position 122. In step S408 that controller may unload the carrier substrates(s) from the bonding heads if there are no more chiplets on the bonding heads or no more chiplets to be placed. After step S408 the process may stop or one or more carrier substrates(s) 111 may be loaded onto the bonding heads 110 as the process continues in step S402.

Figure 5:
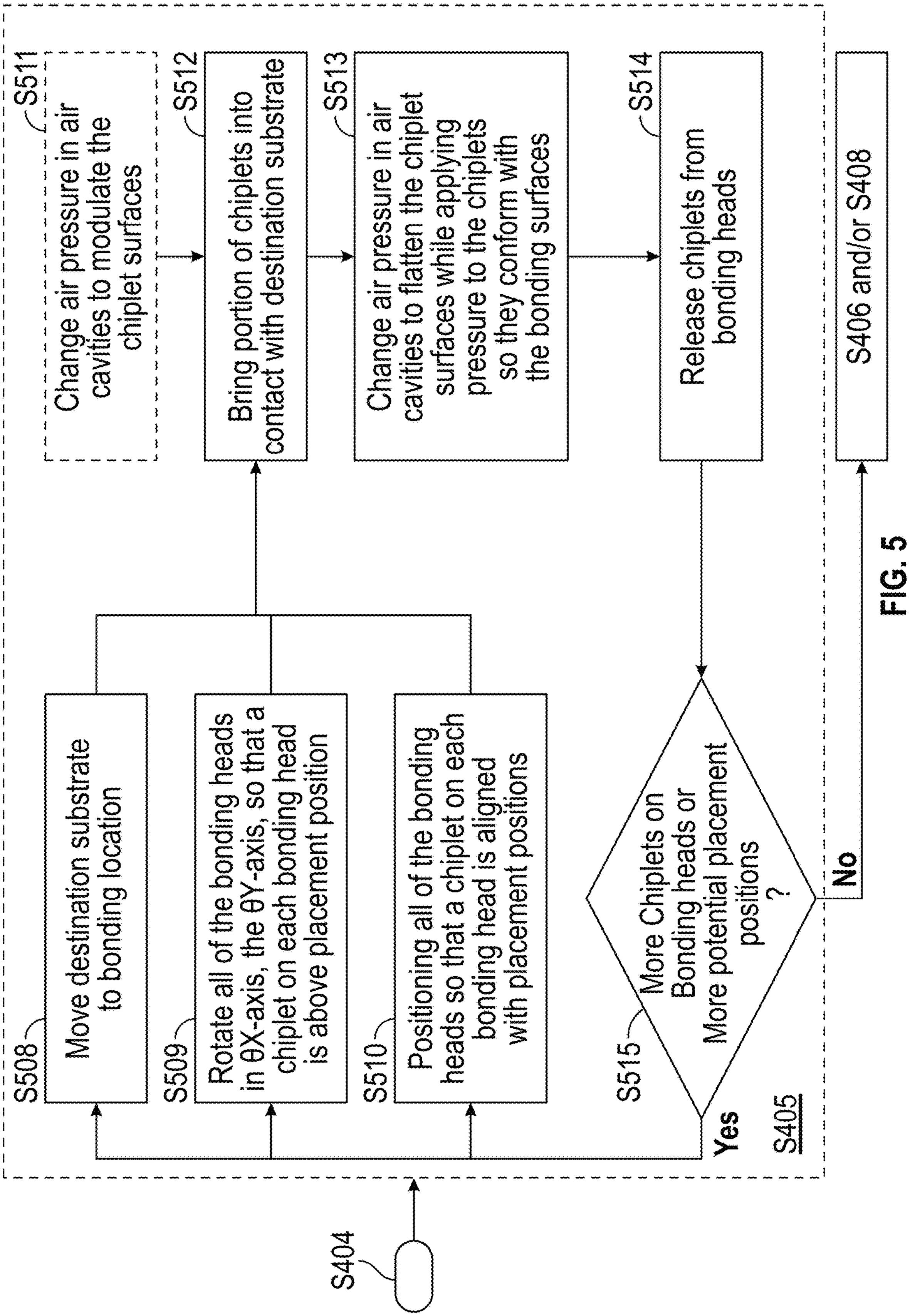
FIG. 5 is a flowchart showing the operation sequence of the bonding step in FIG.

The bonding process step S405 will be explained in further details with reference to FIG. 5. Steps S508 to S510 are performed during the bonding process of step S405. The controller 130 may send instructions to for the base stage 150 so that the destination chuck 120 has multiple predetermined placement positions 122 each under a different curved bonding head 110 in a destination substrate positioning step S508. Each bonding head driving mechanism 181 can rotate a curved bonding head 110 in the θX and θY directions so that target chiplets that are to be bonded are substantially parallel to predetermined placement positions 122 in a bonding head rotation step S509. The bonding head driving mechanisms 181 will also adjust the relative position of the bonding heads in the X, Y, θZ directions so that the chiplet interconnect contacts are substantially aligned with the destination interconnect contacts in a bonding head alignment step S510. Once the chiplet interconnect contacts are substantially aligned with the destination interconnect contacts, the bonding head driving mechanisms 181 will drive the bonding heads in the −Z direction so that at least a portion of the target chiplet 112 on each curved bonding head are brought into contact with the destination substrates 121 in an initial bonding step S512.

If the bonding head 110 is configured with air cavity as described above in connection with FIGS. 3A-3D, the air cavity 310 is pressurized before the target template is brought into contact with the destination substrate 121 in step S512 such that only a portion of the target template is brought into contact in an optional modulation step S511.

The controller 130 may then reduce the pressure in the air cavity 310 to flatten the surfaces of the bonding surfaces of the curved bonding heads 110 and chiplets 112 and bring the curved bonding heads 110 closer to the destination chuck 120, until the target chiplet is in full contact with the destination substrate 121. In this process, sufficient pressure is applied to the target chiplet 112 to conform to the shape of the destination substrate 121 in a conforming step S513. Depending on the application and the structure of the curved bonding heads 110, the bonding process may be performed without modulating the air pressure of the air cavity 310 in steps S512 and S513. Then, the controller 130 releases the target chiplet 112 by activating the light source 182 to emit light at a specific wavelength such that the chiplet is released from the carrier substrate 111 and bonded to the target predetermined placement position 122 on the destination substrate 121 in a releasing step S514. Alternatively, ultrasonic waves, a pressure adjustment, or mechanical pins may be applied to the carrier substrate 111 and/or the bridge 180 as the releasing mechanism when the destination substrate 121 and the target chiplet 112 are in contact with each other. Alternatively, when the chiplets are held directly by the curved bonding head 110, the curved bonding head 110 may release the holding force applied to the chiplets 112 by adjusting a holding pressure. After bonding the destination substrate 121 and the target chiplet 112, the controller 130 releases the holding of the target chiplet 112 by the curved bonding head 110.

In this manner, each of the plurality of curved bonding heads 110 can simultaneously and independently bond a chiplet to the respective destination substrate per cycle. Upon completion of the bonding of a target chiplet, the curved bonding head 110 rotates and positions another (for example the adjacent) chiplet with another (for example the adjacent) predetermined placement position such that another chiplet is substantially parallel with another predetermined placement position. Then, another chiplet is bonded by the releasing method as described above. In this manner, each of the chiplets can be sequentially bonded onto the predetermined placement positions of the destination substrate. The bonding process continues until all target chiplets 112 have been bonded or no more predetermined placements positions are available. The controller 130 may then check to see if more chiplets are on the curved bonding heads 110 in a checking step S515. If the answer is yes then steps S508-514 are repeated until all of the predetermined placement positions 112 on the destination substrate 121 have been populated with chiplets 112. If there are no more chiplets 112 on the curved bonding heads 110 (NO in step S515), the process proceeds to step S406. The bonding step may include repeating steps S408, S402, and S404 if one or more of the carrier substrates 111 are depopulated before the destination substrate 121 is fully populated.

In step S406, the controller 130 unloads the destination substrate 121 from a substrate chuck 120 using a conveyance mechanism (not shown), and unloads the carrier substrates 111 from plurality of curved bonding heads using a bonding head conveyance mechanism (not shown). Then the process proceeds to step S407. In step S407, the controller 130 determines whether to continue chiplet bonding to a new substrate. If it is determined that further chiplet bonding is needed (Yes in step S407), the process return to step S401 and the process steps S401-S406 will be repeated. However, if it is determined that no further bonding is necessary (No in step S407), the process will end. Once the destination substrate 121 has been unloaded from the destination chuck 120, the destination substrate may be subjected to an annealing process. The annealing process may include subjecting one or more destination substrates to an annealing temperature for example (200-500° C.) for a soak time (for example 10-90 minutes).

<Embodiment of Article Manufacturing Method>

A method of manufacturing an article (for example, a system on a chip, a semiconductor IC element, a liquid crystal element, a MEMS system, a multi-chiplet package, a flat panel display module, a sensor module, a multi-sensor module, a transceiver, a multi-IP module, a multi-device type module, or the like) using the above-described bonding apparatus will be described. The article manufacturing method according to the embodiment of the present invention is suitable for, for example, manufacturing an article such as a microdevice that includes for example a chiplet and a substrate and may include multiple chiplets that communicate with each other via interconnect contacts (each of the chiplets may be for example, a semiconductor device, a micro-electromechanical (MEMS) device, an optical device, an electrical-optical device, a microfluidic device, a piezoelectric device, a thermoelectric device, a spintronic device, or a superconducting device, etc.) or an element having a microstructure. The article manufacturing method according to the embodiment includes a step of bonding a chiplet to a destination substrate using the above-described bonding apparatus, a step of processing the destination substrate to which the is the chiplets are bonded, and a step of manufacturing an article from the processed first member. The subsequent step is one or more known manufacturing step including probing, dicing, bonding, packaging, and the like. The article manufacturing method according to the embodiment is superior to a conventional method in at least one of the performance, quality, productivity, and production cost of an article.

Other Embodiments

Embodiment(s) of the present disclosure can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like. While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

What is claimed is:

1. An apparatus for bonding multiple pluralities of chiplets to a destination substrate, comprising:

one or more bonding heads, each bonding head of the one or more bonding heads having a curved surface configured to hold a plurality of chiplets;

a destination stage configured to hold the destination substrate; and a controller configured to operate the movement of the one or more bonding heads and the destination stage, wherein the controller includes a plurality of motors configured to drive each bonding head of the one or more bonding heads in at least in the θX, θY, and Z, directions, and wherein the curved surface is a convex surface having a curvature bulging towards the destination stage.

2. The apparatus according to claim 1, wherein each bonding head of the one or more bonding heads is configured to simultaneously release a chiplet of the plurality of chiplets to the destination substrate when the chiplets come in parallel or substantially parallel with the destination substrate.

3. The apparatus according to claim 1, wherein one or more chiplet of the plurality of chiplets has a different thickness than another chiplet of the plurality of chiplets.

4. The apparatus according to claim 1, further comprises a releasing unit configured to release the plurality of chiplets from each bonding head of the one or more bonding heads to the destination substrate, wherein the releasing unit is configured to release the plurality of chiplets via an ultraviolet mechanism, an infrared mechanism, or a pressure mechanism.

5. The apparatus according to claim 4, wherein the one or more bonding heads are translucent, and the releasing unit includes a light source and a steering mirror or a light modulation unit, wherein the releasing unit is configured to release a chiplet among the plurality chiplets when it is illuminated by the light source.

6. The apparatus according to claim 4, wherein the controller is configured to move the one or more bonding heads, the destination stage, and the releasing unit in one or more directions in X, Y, Z, θX, θY, and θZ directions.

7. The apparatus according to claim 1, wherein each chiplet of the plurality chiplets is deformed corresponding to the curvature.

8. The apparatus according to claim 1, wherein each bonding head of the one or more bonding heads includes an air cavity configured to modulate the curvature.

9. The apparatus according to claim 1, wherein the plurality of chiplets are sequentially released to the destination substrate.

10. The apparatus according to claim 1, wherein the curved surface includes a plurality of polyhedral flat surfaces, and wherein each chiplet of the plurality of chiplets is coupled with one of the plurality of polyhedral flat surfaces.

11. The apparatus according to claim 1, wherein the curved surface is configured to hold the plurality of chiplets via an intermediate substrate.

12. The apparatus according to claim 11, wherein while the intermediate substrate is in a curved state on a bonding head of the one or more bonding heads, each chiplet of the plurality of chiplets is attached to a planar facet of the intermediate substrate.

13. The apparatus according to claim 11, each chiplet of the plurality of chiplets is attached to a mesa on the intermediate substrate.

14. A method of bonding multiple pluralities of chiplets to a destination substrate with an apparatus that includes one or more bonding heads, each bonding head of the one or more bonding heads having a curved surface configured to hold a plurality of chiplets, the method, comprising:

holding the destination substrate; and moving the one or more bonding heads and the destination stage in at least the θX, θY, and Z directions, wherein the curved surface is a convex surface having a curvature bulging towards the destination stage.

15. The method according to claim 14, wherein the plurality of chiplets are simultaneously released from each bonding head of the one or more bonding heads to the destination substrate when the plurality of chiplets come in parallel or substantially parallel with the destination substrate.

16. The method according to claim 14, wherein one or more chiplet of the plurality of chiplets has a different thickness than another chiplet of the plurality of chiplets.

17. The method according to claim 14, further comprises releasing the plurality of chiplets from each bonding head of the one or more bonding heads to the destination substrate, wherein the releasing of the plurality of chiplets is performed via an ultraviolet mechanism, an infrared mechanism, or a pressure mechanism.

18. The method according to claim 14, wherein the curved surface includes a plurality of polyhedral flat surfaces, and wherein each chiplet of the plurality of chiplets is coupled with one of the plurality of polyhedral flat surfaces.

19. The method of claim 14, wherein each chiplet of the plurality of chiplets is deformed corresponding to the curvature.

20. The method according to claim 14, wherein each bonding surface of the one or more bonding heads includes an air cavity configured to modulate the curvature.

21. The method according to claim 14, wherein the plurality of chiplets are sequentially released to the destination substrate.

22. The method according to claim 14, wherein the one or more bonding heads, the destination stage, and a releasing unit are configured to move in one or more directions in X, Y, Z, θX, θY, and θZ directions.

23. The method according to claim 14, further comprising:

processing the destination substrate on which the plurality of chiplets have been bonded to manufacture a plurality of articles.

24. The method according to claim 14, wherein each bonding head of the one or more bonding heads is rotated about one or more axes parallel to the destination substrate so that only one chiplet of the plurality of chiplets on each bonding head of the one or more bonding heads is bonded to the destination substrate.

* * * * *